(12) United States Patent
Devilliers et al.

(10) Patent No.: US 11,721,551 B2
(45) Date of Patent: *Aug. 8, 2023

(54) LOCALIZED STRESS REGIONS FOR THREE-DIMENSION CHIPLET FORMATION

(71) Applicant: Tokyo Electron Limited, Tokyo (JP)

(72) Inventors: Anton J. Devilliers, Clifton Park, NY (US); Daniel J. Fulford, Albany, NY (US); Anthony R. Schepis, Averill Park, NY (US); Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 36 days.

This patent is subject to a terminal disclaimer.

(21) Appl. No.: 17/473,248

(22) Filed: Sep. 13, 2021

(65) Prior Publication Data

US 2022/0238328 A1 Jul. 28, 2022

Related U.S. Application Data

(60) Provisional application No. 63/141,552, filed on Jan. 26, 2021.

(51) Int. Cl.
*H01L 21/027* (2006.01)
*H01L 23/16* (2006.01)
*H01L 23/498* (2006.01)

(52) U.S. Cl.
CPC .......... *H01L 21/0274* (2013.01); *H01L 23/16* (2013.01); *H01L 23/49822* (2013.01)

(58) Field of Classification Search
CPC ................. H01L 21/0274; H01L 23/16; H01L 23/49822; H01L 2221/68327; H01L 2221/6834; H01L 21/6835; H01L 2225/06568; H01L 25/0657; H01L 21/78; H01L 21/7806; H01L 25/50

(Continued)

(56) References Cited

U.S. PATENT DOCUMENTS

| 7,675,182 B2 * | 3/2010 | Sun ...................... H01L 23/3157 257/788 |
| 7,799,856 B2 * | 9/2010 | Nohara .................... C08K 5/54 524/262 |

(Continued)

*Primary Examiner* — Vu A Vu
(74) *Attorney, Agent, or Firm* — Oblon, McClelland, Maier & Neustadt, L.L.P.

(57) ABSTRACT

Aspects of the present disclosure provide a method for forming a chiplet onto a semiconductor structure. For example, the method can include providing a first semiconductor structure having a first circuit and a first wiring structure formed on a first side thereof. The method can further include attaching the first side of the first semiconductor structure to a carrier substrate. The method can further include forming a stress film on a second side of the first semiconductor structure. The method can further include separating the carrier substrate from the first semiconductor structure. The method can further include cutting the stress film and the first semiconductor structure to define at least one chiplet. The method can further include bonding the at least one chiplet to a second semiconductor structure having a second circuit and a second wiring structure such that the second wiring structure is connected to the first wiring structure.

16 Claims, 12 Drawing Sheets

(58) Field of Classification Search
USPC .......................................................... 438/106
See application file for complete search history.

(56) References Cited

U.S. PATENT DOCUMENTS

| | | | | |
|---|---|---|---|---|
| 8,902,604 | B2* | 12/2014 | Zoellin | H04R 19/005 |
| | | | | 381/175 |
| 9,281,280 | B2* | 3/2016 | Schelling | H01L 24/27 |
| 9,318,454 | B2* | 4/2016 | Matsui | H01L 23/49811 |
| 9,362,143 | B2* | 6/2016 | Sun | H01L 21/563 |
| 9,502,271 | B2* | 11/2016 | Yu | H01L 23/562 |
| 10,373,927 | B2* | 8/2019 | Tsukao | H05K 3/323 |
| 10,679,914 | B2* | 6/2020 | Lai | H01L 24/20 |
| 10,868,353 | B2* | 12/2020 | Lu | H01L 24/13 |
| 2008/0182432 | A1* | 7/2008 | Huang | H01L 21/486 |
| | | | | 29/825 |
| 2018/0068861 | A1* | 3/2018 | deVilliers | G03F 7/70783 |
| 2018/0254232 | A1* | 9/2018 | Lai | H01L 21/78 |

\* cited by examiner

LOCALIZED STRESS REGIONS FOR THREE-DIMENSION CHIPLET FORMATION

INCORPORATION BY REFERENCE

The present disclosure claims the benefit of U.S. Provisional Application No. 63/141,552, "Method of Making Localized Stress Regions for Advanced 3D Chiplet Formation" filed on Jan. 26, 2021, which is incorporated herein by reference in its entirety.

FIELD OF THE PRESENT DISCLOSURE

The present disclosure relates generally to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Aspects of the present disclosure provide a method for forming a chiplet onto a semiconductor structure. For example, the method can include providing a first semiconductor structure having a first circuit and a first wiring structure formed on a first side thereof, and attaching the first side of the first semiconductor structure to a carrier substrate. The method can further include forming a stress film on a second side of the first semiconductor structure, and separating the carrier substrate from the first semiconductor structure. The method can further include cutting the stress film and the first semiconductor structure to define at least one chiplet, and bonding the at least one chiplet to a second semiconductor structure that has a second circuit and a second wiring structure such that the second wiring structure is connected to the first wiring structure. In an embodiment, the method can further include removing the stress film after the at least one chiplet is bonded to the second semiconductor structure.

In an embodiment, the method can further include patterning the stress film to form a patterned stress film, and cutting the stress film and the first semiconductor structure to define at least one chiplet can include cutting the patterned stress film and the first semiconductor structure to define at least one chiplet. In an embodiment, the patterned stress film can be formed via a mask-based lithography tool, ultraviolet (UV) cross-linking or a direct-write lithography tool. For example, the patterned stress film can be formed via the direct-write lithography tool using a digital light processing (DLP) chip, a grating light valve or a laser galvanometer. In an embodiment, the method can further include removing the patterned stress film after the at least one chiplet is bonded to the second semiconductor structure.

In an embodiment, the first semiconductor structure can further have a first dielectric layer formed on the second side thereof, and forming a stress film on a second side of the first semiconductor structure can include forming a stress film on the first dielectric layer of the first semiconductor structure. For example, the first semiconductor structure can further have a first substrate formed on the first dielectric layer, and the method can further include, prior to forming a stress film on the first dielectric layer of the first semiconductor structure, removing the first substrate to uncover the first dielectric layer.

In an embodiment, the first side of the first semiconductor structure can be attached to the carrier substrate using an attachment material, and separating the carrier substrate from the first semiconductor structure can include heating the attachment material such that the carrier substrate is separated from the first semiconductor structure.

Aspects of the present disclosure further provide another method for forming a chiplet onto a semiconductor structure. For example, the method can include providing a first semiconductor structure having a first circuit and a first wiring structure formed on a first side thereof, and attaching the first side of the first semiconductor structure to a carrier substrate. The method can further include forming a stress film on a second side of the first semiconductor structure, and cutting the stress film and the first semiconductor structure to define at least one chiplet. The method can further include separating the carrier substrate from the at least one chiplet, and bonding the at least one chiplet to a second semiconductor structure that has a second circuit and a second wiring structure such that the second wiring structure is connected to the first wiring structure.

In an embodiment, the method can further include patterning the stress film to form a patterned stress film, and cutting the stress film and the first semiconductor structure to define at least one chiplet can include cutting the patterned stress film and the first semiconductor structure to define at least one chiplet. In an embodiment, the patterned stress film can be formed via a mask-based lithography tool, UV cross-linking or a direct-write lithography tool. For example, the patterned stress film can be formed via the direct-write lithography tool using a DLP chip, a grating light valve or a laser galvanometer.

In an embodiment, the first semiconductor structure can further have a first dielectric layer formed on the second side thereof, and forming a stress film on a second side of the first semiconductor structure can include forming a stress film on the first dielectric layer of the first semiconductor structure. For example, the first semiconductor structure can further have a first substrate formed on the first dielectric layer, and the method can further include, prior to forming a stress film on the first dielectric layer of the first semiconductor structure, removing the first substrate to uncover the first dielectric layer.

In an embodiment, the first side of the first semiconductor structure can be attached to the carrier substrate using an attachment material, and cutting the stress film and the first semiconductor structure to define at least one chiplet can include cutting the stress film, the first semiconductor structure and the attachment material to define at least one chiplet. For example, cutting the stress film, the first semiconductor structure and the attachment material to define at least one chiplet can include cutting the stress film, the first semiconductor structure, the attachment material and a portion of the carrier substrate to define at least one chiplet.

In an embodiment, the first side of the first semiconductor structure can be attached to the carrier substrate using an attachment material, and separating the carrier substrate from the at least one chiplet can include heating the attachment material such that the carrier substrate is separated from the at least one chiplet.

In an embodiment, the method can further include, prior to separating the carrier substrate from the at least one chiplet, forming a chiplet supporter on the stress film of the at least one chiplet. For example, the method can further include removing the chiplet supporter and the stress film after the at least one chiplet is bonded to the second semiconductor structure.

This summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION 3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array) and SoC (System on a chip)) is being pursued.

As microelectronic devices are fabricated on wafers, the wafer itself is subject to various stresses from the different materials added, removed, as well as treatment steps such as annealing. Such stresses can cause overlay problems from wafer bow, warpage and curvature. These problems can increase with wafers stacked on wafers. Techniques herein include systems and methods to mitigate wafer stress complications from stacked wafers and chiplets.

Techniques herein can include selective stress (or stressor) film technology and creating relatively thin chiplets to attach or bond to a semiconductor structure, e.g., a wafer or a die. One or more stress films can be deposited on a surface (e.g., a back, second or inactive side, or opposite to a front, first, active or working side) of the chiplets. In an embodiment, a direct-write lithographic exposure tool can be used to write a corrected stress pattern on the back side of chiplets before being cut and placed on or bonded to a wafer. Chiplets can receive identical or different stress films and identical or different stress-correction patterns for localized stress regions. This enables higher density of 3D chiplets to be stacked because the thickness of the chiplet may be greatly reduced. These techniques also enable higher die yield per wafer because the wafer has less bow or curvature which enables higher precision photolithography.

The order of discussion of the different steps as described herein has been presented for clarity sake. In general, these steps can be performed in any suitable order. Additionally, although each of the different features, techniques, configurations, etc. herein may be discussed in different places of the present disclosure, it is intended that each of the concepts can be executed independently of each other or in combination with each other. Accordingly, the present invention can be embodied and viewed in many different ways.

Figure 1:
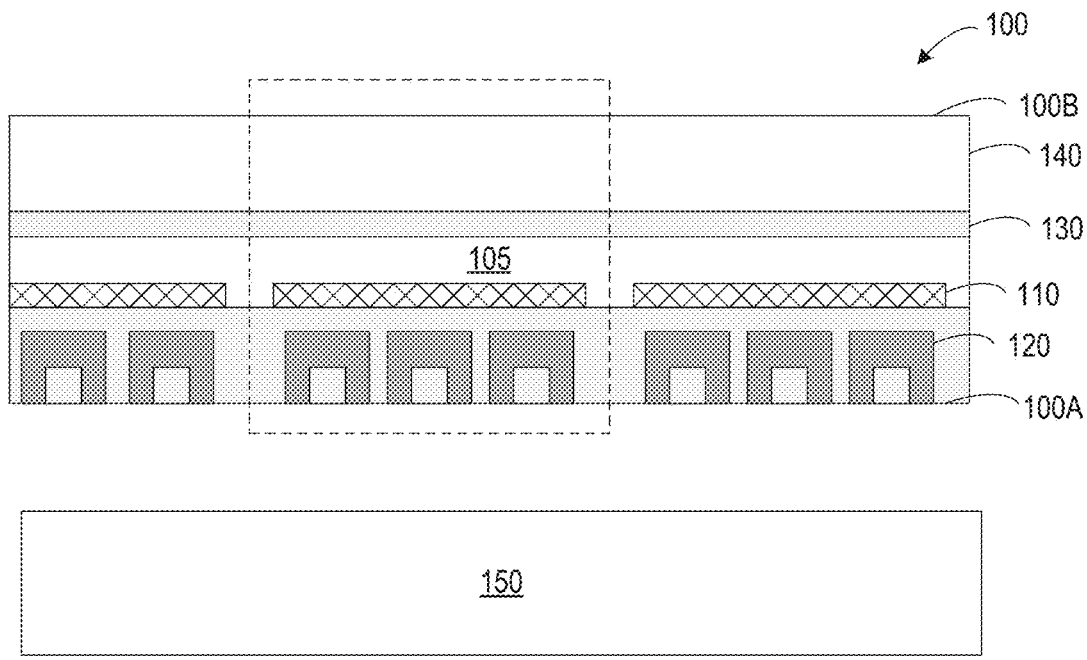
FIGS. 1-10 are cross-sectional views illustrating a first exemplary method for forming a chiplet onto a semiconductor structure according to some embodiments of the present disclosure.

FIGS. 1-10 are cross-sectional views illustrating a first exemplary method for forming a chiplet onto a semiconductor structure according to some embodiments of the present disclosure. As shown in FIG. 1, a first semiconductor structure 100 can be provided. In an embodiment, the first semiconductor structure 100 can have a first circuit (or a first active circuit) 110 and a first wiring structure 120 formed on a first side 100A (or a front side, an active side or a working side) of the first semiconductor structure 100. For example, the first circuit 110 can be formed in bulk silicon 105 of the first semiconductor structure 100. As another example, the first wiring structure 120 can include vias and copper layers. In an embodiment, the first circuit 110 and the first wiring structure 120 can be used as chiplets. A chiplet herein can be a component device or integrated circuit or a portion thereof that is a component of a larger module, assembly, package, or an integrated circuit. A chiplet can be cut from a larger device or wafer, e.g., the first semiconductor structure 100. A dashed line shown in FIG. 1 can identify an example chiplet.

In an embodiment, the first semiconductor structure 100 can further have a first dielectric layer 130 and a first substrate 140 formed on a second side (or a back side or an inactive side) 100B of the first semiconductor structure 100. For example, the first substrate 140 can be a silicon substrate. In the fabrication of the first semiconductor structure 100, a silicon-on-insulator (SOI) substrate, which is composed of the first substrate 140, the first dielectric layer 130 and the bulk silicon 105, can be provided, the first circuit 110 can be formed in the bulk silicon 105 via photolithography, and the first wiring structure 120 can be formed to connect the first circuit 110.

FIG. 1 further shows a carrier substrate 150 for the first semiconductor structure 100 to be attached thereto. For example, the carrier substrate 150 can be a silicon wafer.

Figure 2:
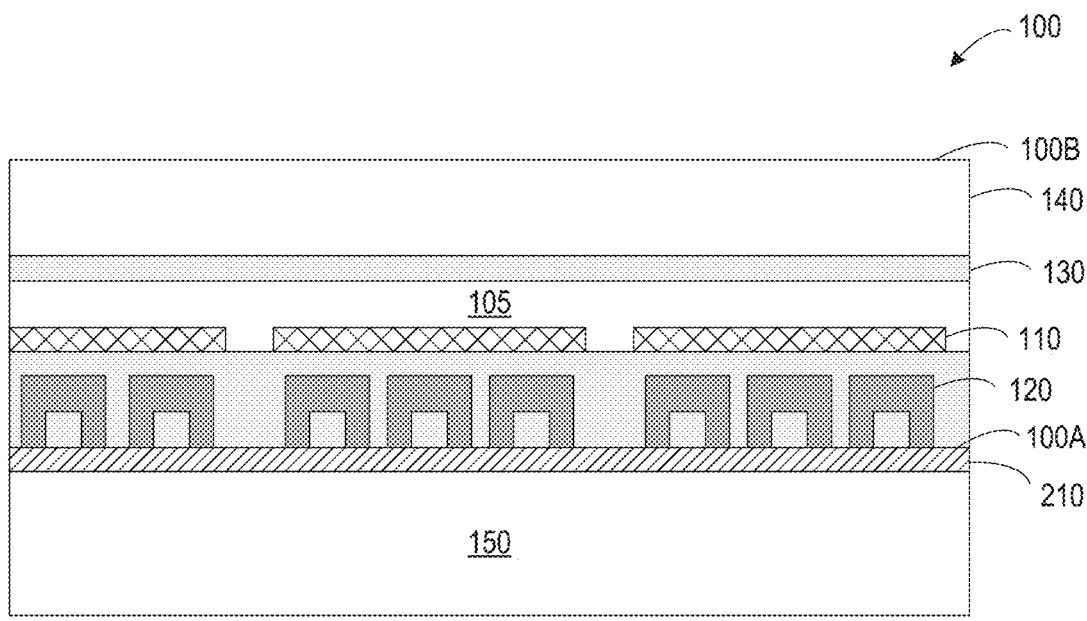

As shown in FIG. 2, the first side 100A of the first semiconductor structure 100 can be attached to the carrier wafer 150 using an attachment material 210. For example, the attachment material 210 can be specified as a glue layer, a bonding layer, a method to bonding wafers that can be removed later, semiconductor to semiconductor with native oxide for dielectric interface, metal to metal, metal with oxide coating, metal with SiC coating, metal with SiCN coating, metal with an attachment film comprising semiconductor with a coating consisting of one or more elements, or a combination thereof.

Figure 3:
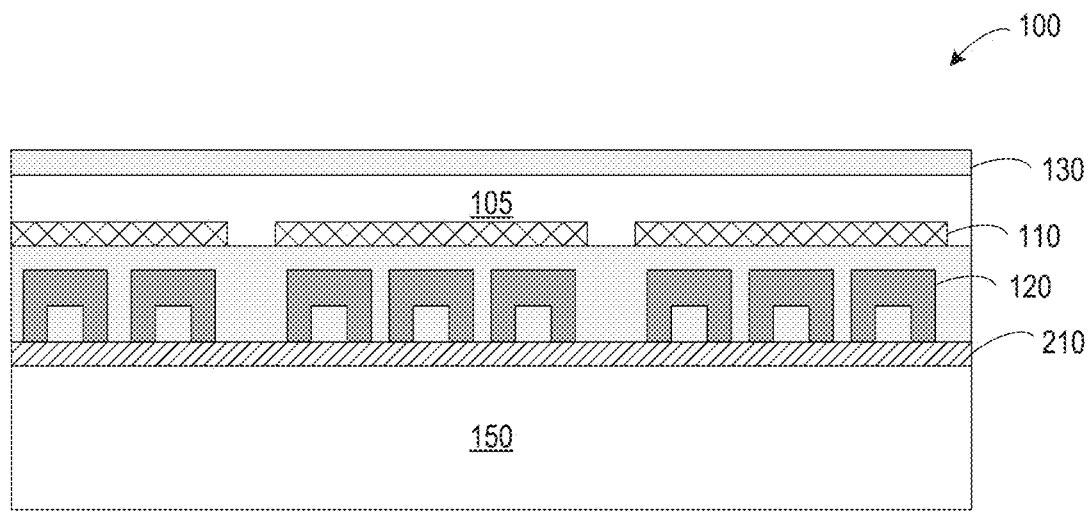

As shown in FIG. 3, the first substrate 140 can be removed to uncover the first dielectric layer 130. For example, the first semiconductor structure 100 can be planarized via chemical-mechanical planarization (or called chemical-mechanical polishing) (CMP), which stops at the first dielectric layer 130, to remove the first substrate 140 and uncover the first dielectric layer 130.

Figure 4:
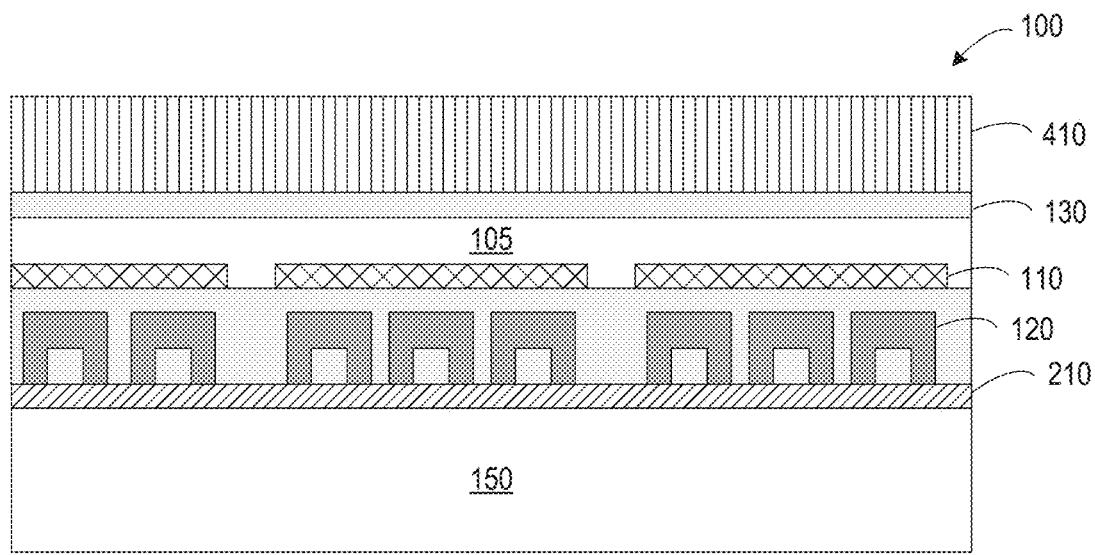

As shown in FIG. 4, a stress film 410 can be formed on the first dielectric layer 130. Any type of stress (i.e., compressive or tensile) may be induced in bulk silicon 105 by attaching or forming the stress film 410 on the dielectric layer 130. For example, a photoresist layer can be applied to or deposited on the first dielectric layer 130 via spin coating to act as the stress film 410. As another example, the stress film 410 can include silicon nitride, silicon oxide, etc, e.g., $Si_3N_4$, $SiO_xN_y$, Si and $SiO_2$. The stress film 410 can also be an ultraviolet (UV) cross-linking stress film that includes a spin-on material, e.g., benzocyclobutene (BCB) and other materials with cross-linking properties. For example, the spin-on material can be exposed with a direct write exposure and then baked to complete processing to establish a desired stress pattern and be used for any one of the exemplary methods.

Figure 5:
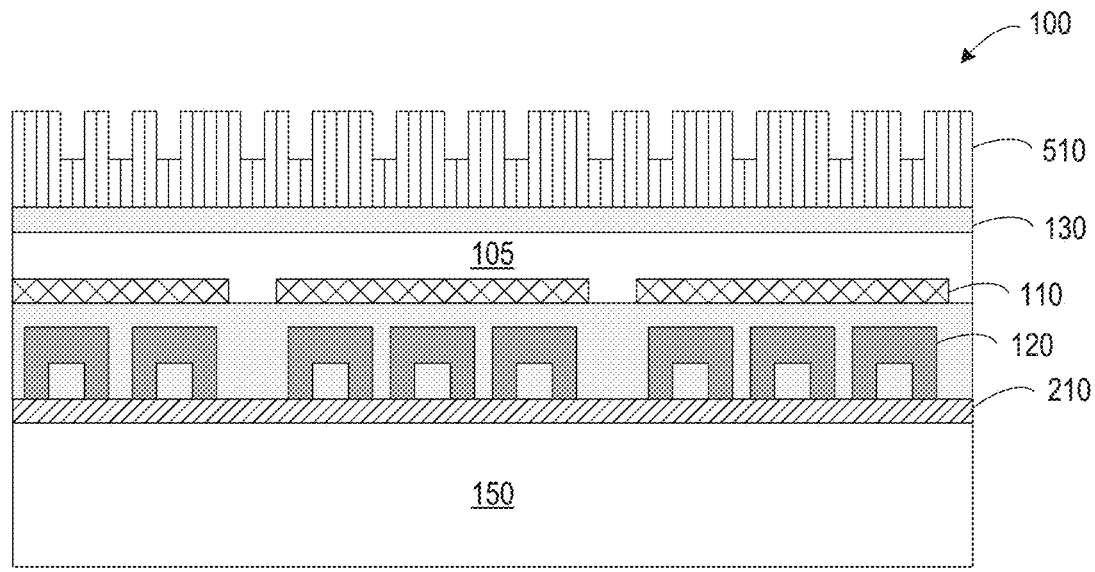

As shown in FIG. 5, optionally, the stress film 410 can be patterned to form a patterned stress film 510. In an embodiment, the stress film 410 can be patterned, exposed and developed to remove the reacted (e.g., positive) photoresist layer and form the patterned stress film 510. For example, a photomask can be used for forming the patterned stress film 510. As another example, the stress film 410, e.g., the photoresist layer, can be patterned with a direct-write (or maskless) lithography tool, which projects simultaneously or uses a scanning motion to project a stress-modification pattern on the photoresist layer or a layer with photo-reactive agents. The patterned photoresist layer can be then developed to create a relief pattern. This relief pattern can serve as a stress film, or be transferred into an underlying layer to become the patterned stress film 510. For example, a digital light processing (DLP) chip can be used. As another example, a grating light valve or laser galvanometer can be used. Direct-write systems are able to use a processing engine to control amount/intensity of light at any given point on a substrate or film to be exposed. Any of various convention light wavelengths can be used based on a photo-reactive agent of a corresponding film (or the film composition can be selected based on light wavelengths available). For stress mitigation, a lower resolution exposure is sufficient to create desired stress modifications (or the patterned stress film 510). Stress-modification patterns (or the patterned stress film 510) herein can make regions of stress induced by stress film (or patterned stress film) vs regions of reduced stress or no stress where the first-write tool has removed the stress film that will make the substrate more planar for optimum photolithography precision.

Figure 6:
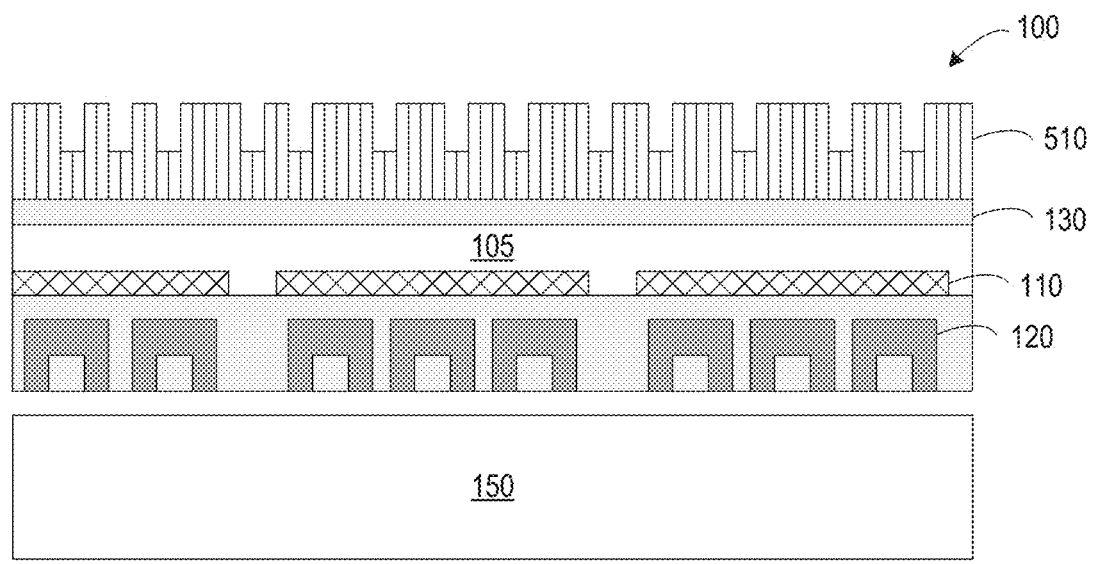

As shown in FIG. 6, the attachment material 210 can be removed to separate the first semiconductor structure 100 from the carrier substrate 150. For example, the attachment material 210 can be a glue layer or a bonding layer, and the glue layer or the bonding layer can be heated and vaporized such that the first semiconductor structure 100 can be separated from the carrier substrate 150.

Figure 7:
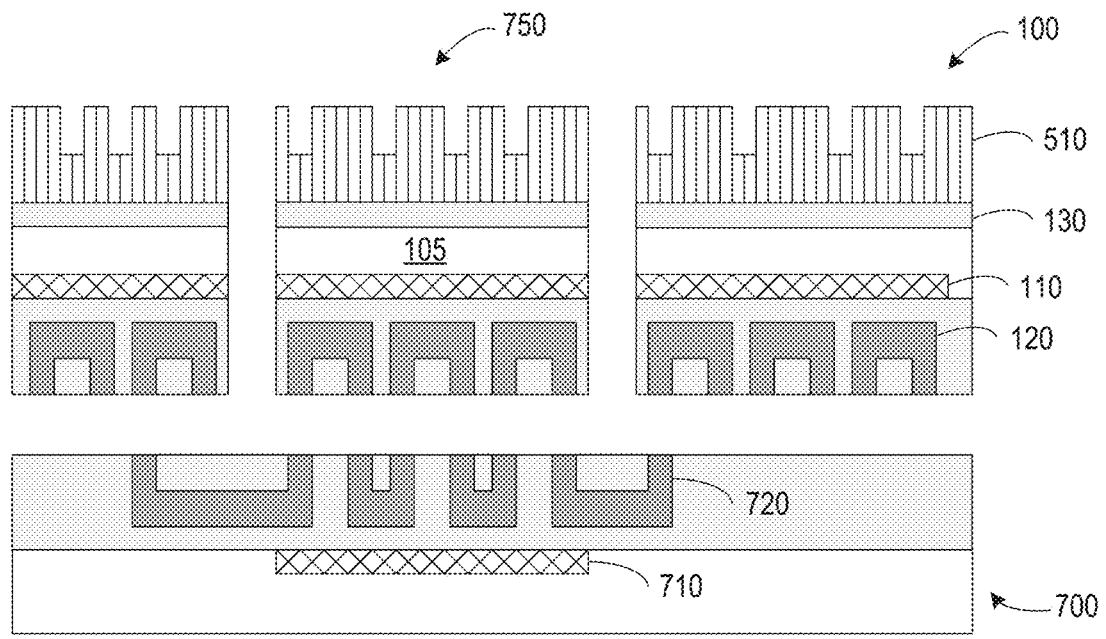

As shown in FIG. 7, the first semiconductor structure 100 along with the patterned stress film 510 (or the stress film 410) can be cut via etching, for example, to define a plurality of chiplets 750. As the patterned stress film 510 (or the stress film 410) is formed on the first semiconductor structure 100, which can allow the first semiconductor structure 100 (and the chiplets 750) to receive identical or different stress films and identical or different stress-correction patterns for localized stress regions and have less complicated wafer stress, the first semiconductor 100 (and the chiplets 750) can have reduced thickness, and higher density of 3D chiplets can be stacked. One or more than one of the chiplets 750 can be bonded to another semiconductor structure. For example, the chiplet 750 can be bonded to a second semiconductor structure 700 that has a second circuit 710 and a second wiring structure 720 that corresponds to the first wiring structure 120 of the first semiconductor structure 100.

Figure 8:
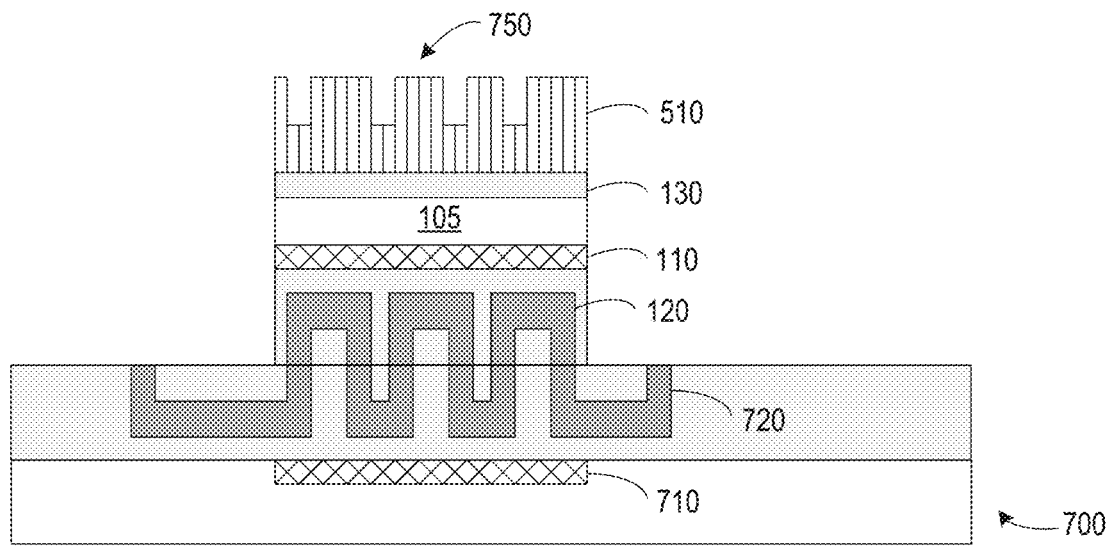

As shown in FIG. 8, the chiplet 750 can be bonded to the second semiconductor structure 700, with the first wiring structure 120 of the chiplet 750 being connected to the second wiring structure 720 of the second semiconductor structure 700.

Figure 9:
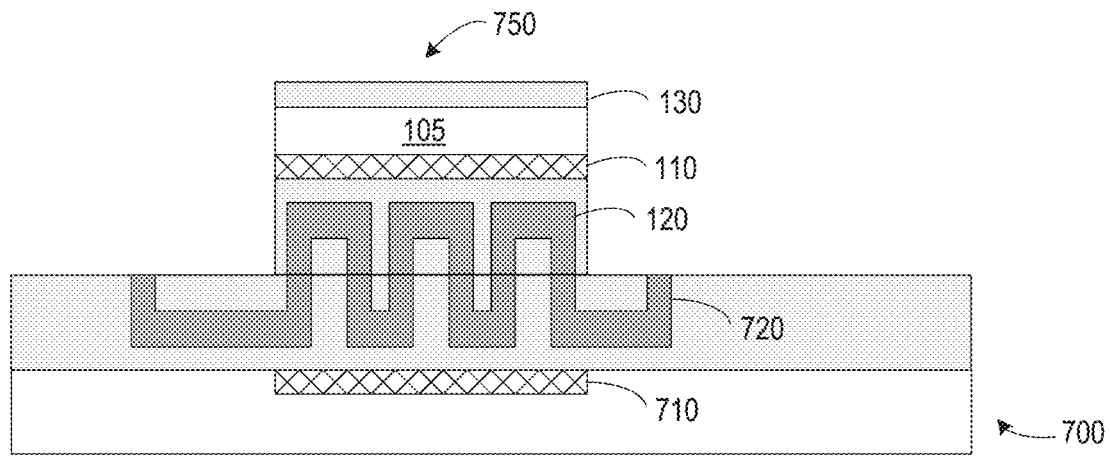

As shown in FIG. 9, the patterned stress film 510 (or the stress film 410) can be removed to uncover the first dielectric layer 130. For example, the patterned stress film 510 (or the stress film 410) can be removed via CMP, which stops at the first dielectric layer 130, to uncover the first dielectric layer 130.

Figure 10:
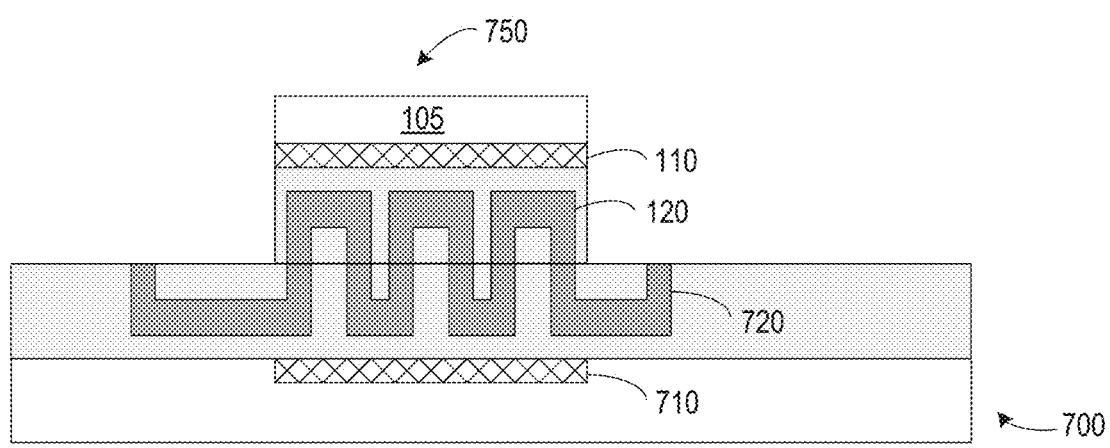

As shown in FIG. 10, the first dielectric layer 130 can be removed. For example, the first dielectric layer 130 can be removed via CMP. In an embodiment, the patterned stress film 510 (or the stress film 410) and the first dielectric layer 130 can be removed in a single CMP process. Therefore, the chiplet 750, which is bonded to the second semiconductor structure 700, can be very thin.

Figure 11:
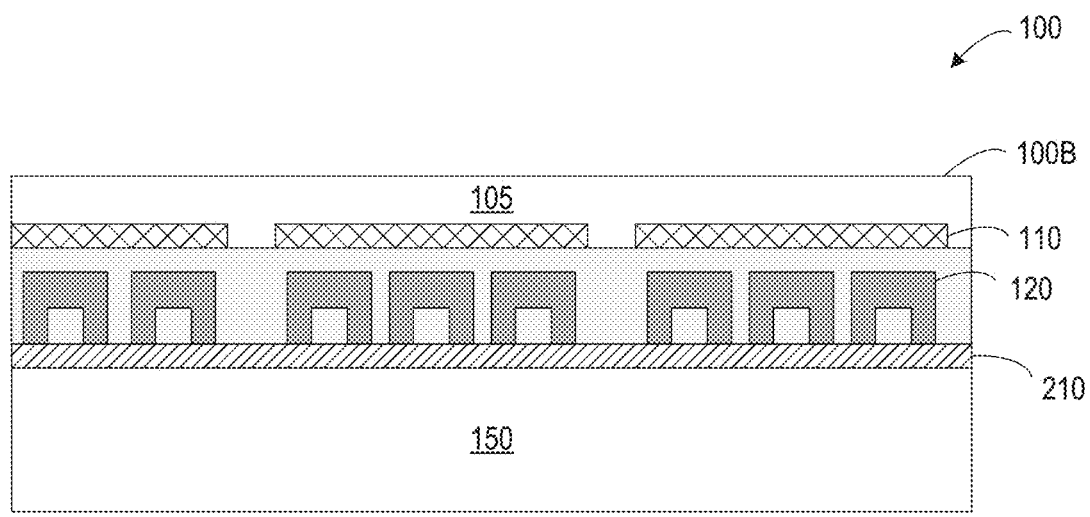
FIGS. 11-16 are cross-sectional views illustrating a second exemplary method for forming a chiplet onto a semiconductor structure according to some embodiments of the present disclosure.

FIGS. 11-16 are cross-sectional views illustrating a second exemplary method for forming a chiplet onto a semiconductor structure according to some embodiments of the present disclosure. The second exemplary method differs from the first exemplary method in that in the second exemplary method, prior to forming the stress film 410, both the first substrate 140 and the first dielectric layer 130 are removed, which can enable optimum stress transfer. As shown in FIG. 11, which follows FIG. 2, the first substrate 140 and the first dielectric layer 130 are removed. For example, the first substrate 140 and the first dielectric layer 130 can be removed in a single CMP process, or be removed in two respective CMP processes, to uncover the second side (or the back side or the inactive side) 100B of the first semiconductor structure 100.

Figure 12:
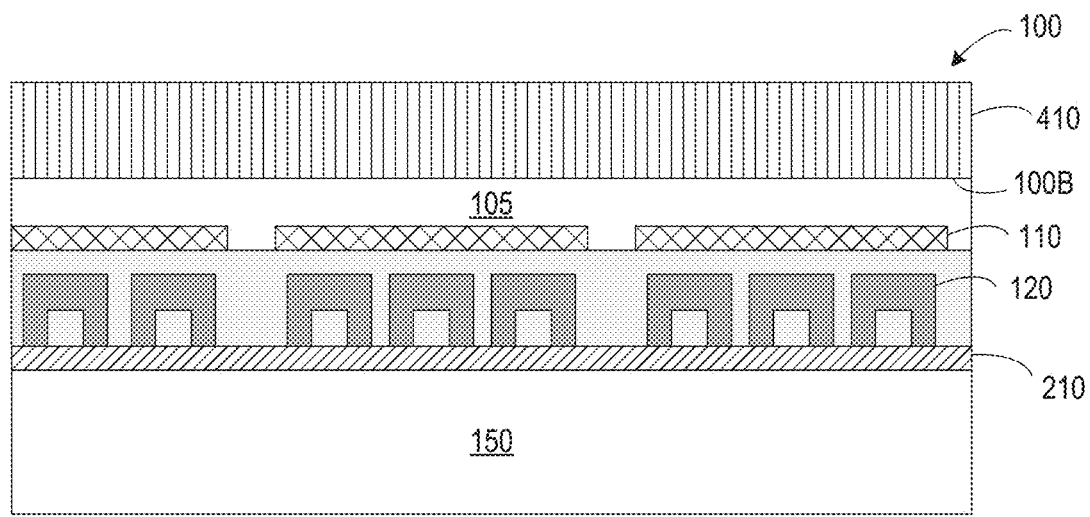

As shown in FIG. 12, the stress film 410 can be formed on the second side 100B of the first semiconductor structure 100 and be in direct contact with the bulk silicon 105 of the first semiconductor structure 100. For example, a photoresist layer can be deposited on the second side 100B to act as the stress film 410.

Figure 13:
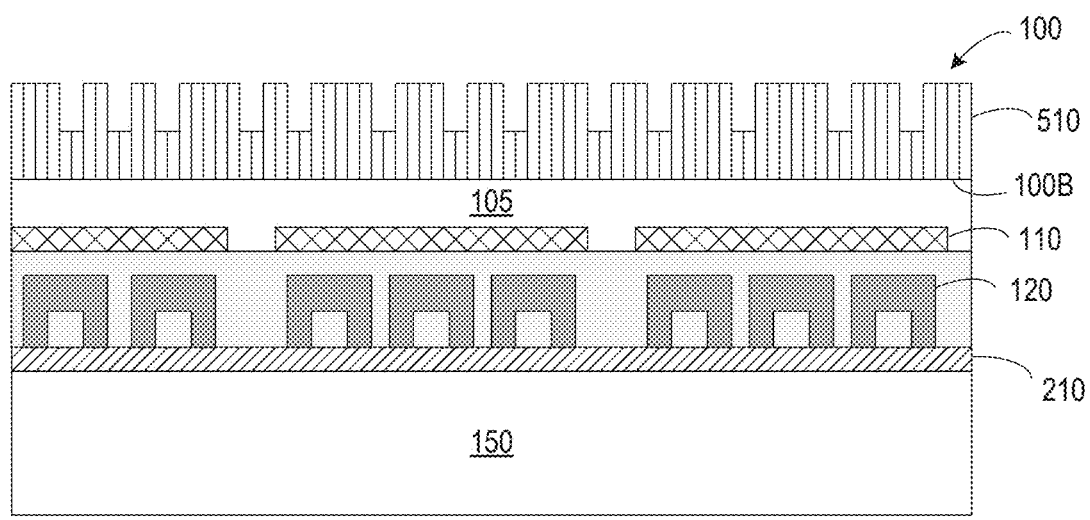

As shown in FIG. 13, optionally, the stress film 410 can be patterned to form the patterned stress film 510. In an embodiment, the stress film 410 can be patterned, exposed and developed to remove the reacted (e.g., positive) resist layer and form the patterned stress film 510. For example, a photomask can be used for forming the patterned stress film 510. As another example, the stress film 410, e.g., the photoresist layer, can be patterned with the direct-write technique. For example, a DLP chip can be used. As another example, a grating light valve or laser galvanometer can be used. Any of various convention light wavelengths can be used based on a photo-reactive agent of a corresponding film (or the film composition can be selected based on light wavelengths available). For stress mitigation, a lower resolution exposure is sufficient to create desired stress modifications (or the patterned stress film 510). Stress-modification patterns (or the patterned stress film 510) herein can make regions of stress induced by stress film (or patterned stress film) vs regions of reduced stress or no stress where the first-write tool has removed at least a portion of the stress film that will make the substrate more planar for optimum photolithography precision. Though the pattern is shown as only partially extending through the stress film 410/the patterned stress film 510, it should be appreciated that the pattern may extend completely through in order to further modify the stress characteristics.

Figure 14:
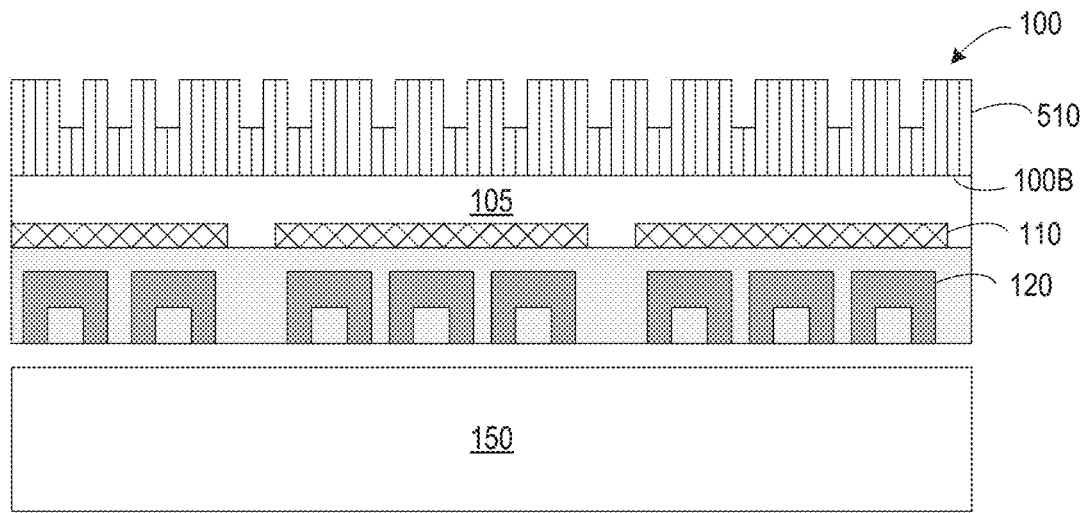

As shown in FIG. 14, the attachment material 210 can be removed to separate the first semiconductor structure 100 from the carrier substrate 150. For example, the attachment material 210 can be heated and vaporized such that the first semiconductor structure 100 can be separated from the carrier substrate 150.

Figure 15:
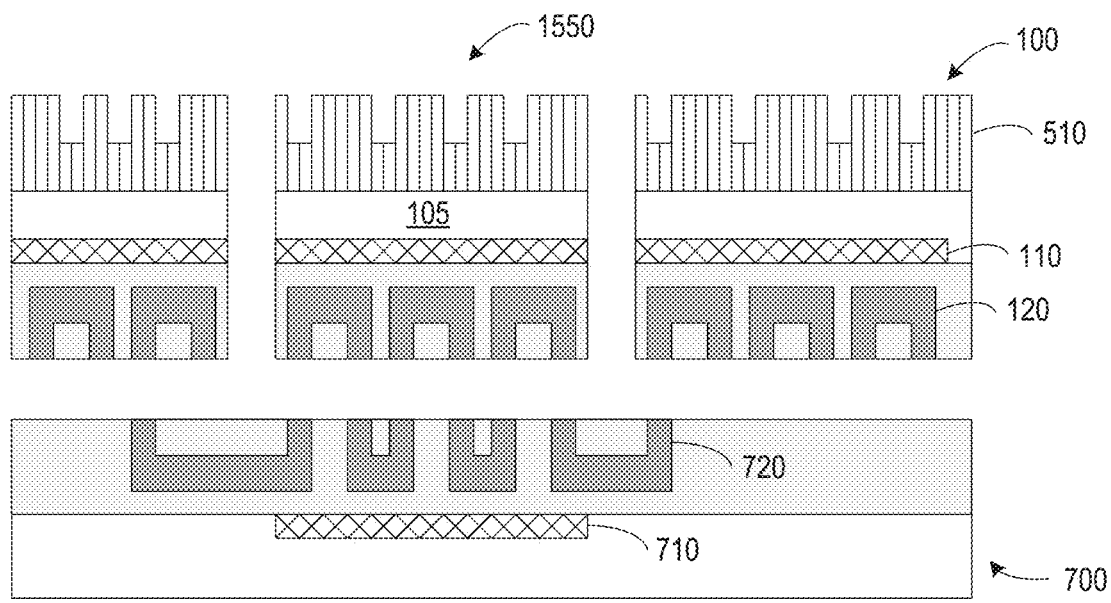

As shown in FIG. 15, the first semiconductor structure 100 along with the patterned stress film 510 (or the stress film 410) can be cut via etching, for example, to define a plurality of chiplets 1550. One or more than one of the chiplets 1550 can be bonded to another semiconductor structure. For example, the chiplet 1550 can be bonded to the second semiconductor structure 700, which has the second circuit 710 and the second wiring structure 720, the second wiring structure 720 corresponding to the first wiring structure 120 of the first semiconductor structure 100.

Figure 16:
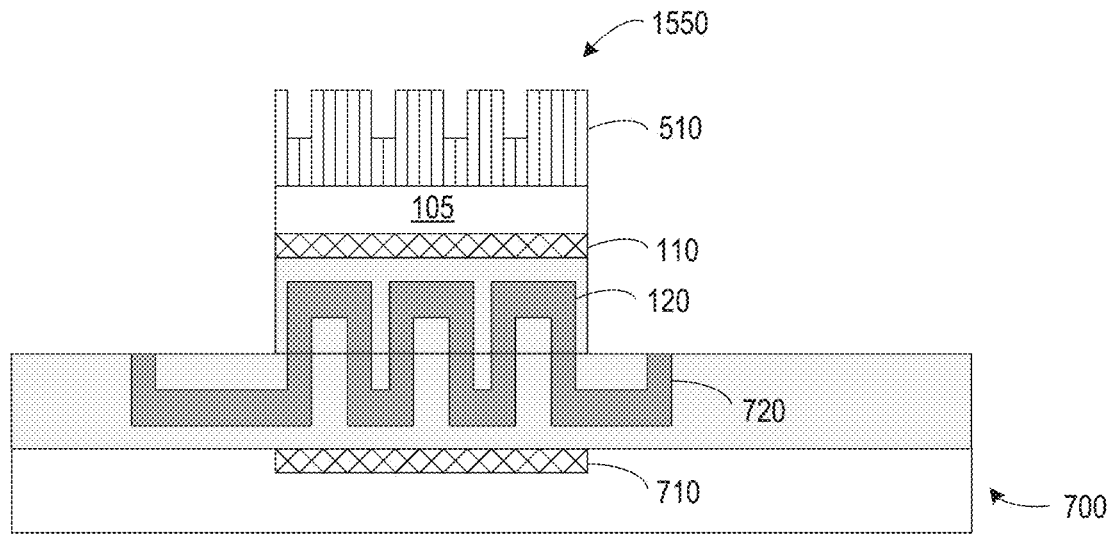

As shown in FIG. 16, the chiplet 1550 can be bonded to the second semiconductor structure 700, with the first wiring structure 120 of the chiplet 1550 being connected to the second wiring structure 720 of the second semiconductor structure 700. Then, the patterned stress film 510 (or the stress film 410) can be removed, to provide the structure as shown in FIG. 10. For example, the patterned stress film 510 (or the stress film 410) can be removed via CMP.

Figure 17:
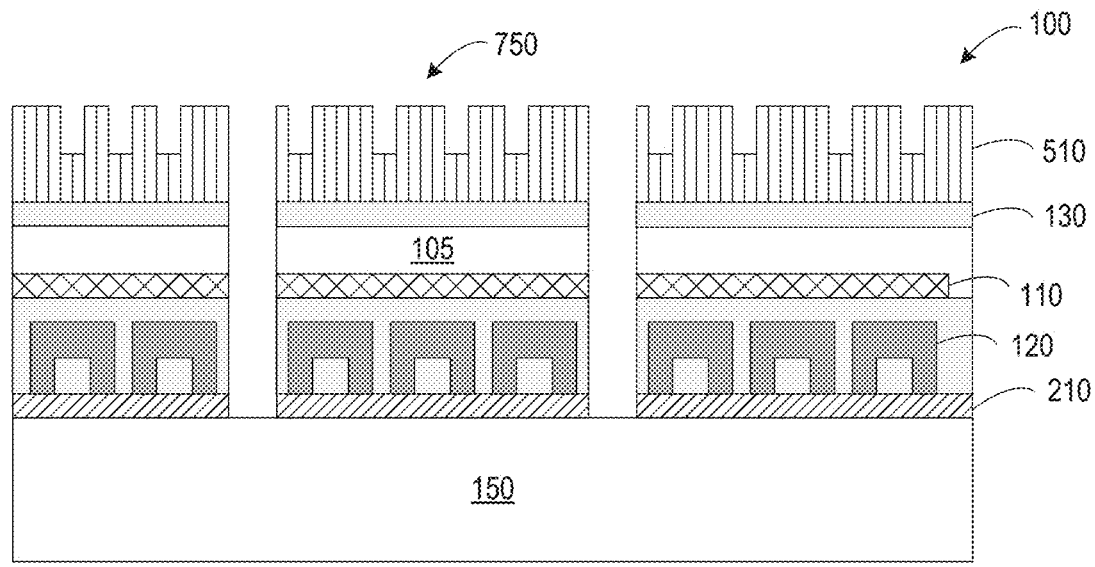
FIGS. 17-20 are cross-sectional views illustrating a third exemplary method for forming a chiplet onto a semiconductor structure according to some embodiments of the present disclosure.

FIGS. 17-20 are cross-sectional views illustrating a third exemplary method for forming a chiplet onto a semiconductor structure according to some embodiments of the present disclosure. The third exemplary method differs from the first and second exemplary methods in that in the third exemplary method the first semiconductor structure 100 along with the first pattern stress film 510 (or the stress film 410) are cut to define the chiplets 750/1550 with the carrier substrate 150 and the attachment material 210 being kept in place and the chiplets 750/1550 being separated from the carrier substrate 150 at a future step at a chiplet level. The third exemplary method can enable control of cutting the chiplets with a thicker underlying substrate. As shown in FIG. 17, which follows FIG. 5, the patterned stress film 510 (or the stress film 410) and the first semiconductor structure 100, which includes the first dielectric layer 130, the first circuit 110 and the first wiring structure 120, and the attachment material 210 can be cut sequentially via etching, for example, to define the chiplets 750. In an embodiment, the cutting process can stop at the carrier substrate 150, as shown in FIG. 17. In another embodiment, the carrier substrate 150 can be etched partially in the cutting process. In yet another embodiment, the cutting process can stop at the attachment layer 210. FIG. 17 can also follow FIG. 13, and the patterned stress film 510 (or the stress film 410) and the first semiconductor structure 100, which includes the first circuit 110 and the first wiring structure 120 (and, optionally, the attachment material 210 and/or a top portion of the carrier substrate 150) can be etched sequentially, to define the chiplets 1550.

Figure 18:
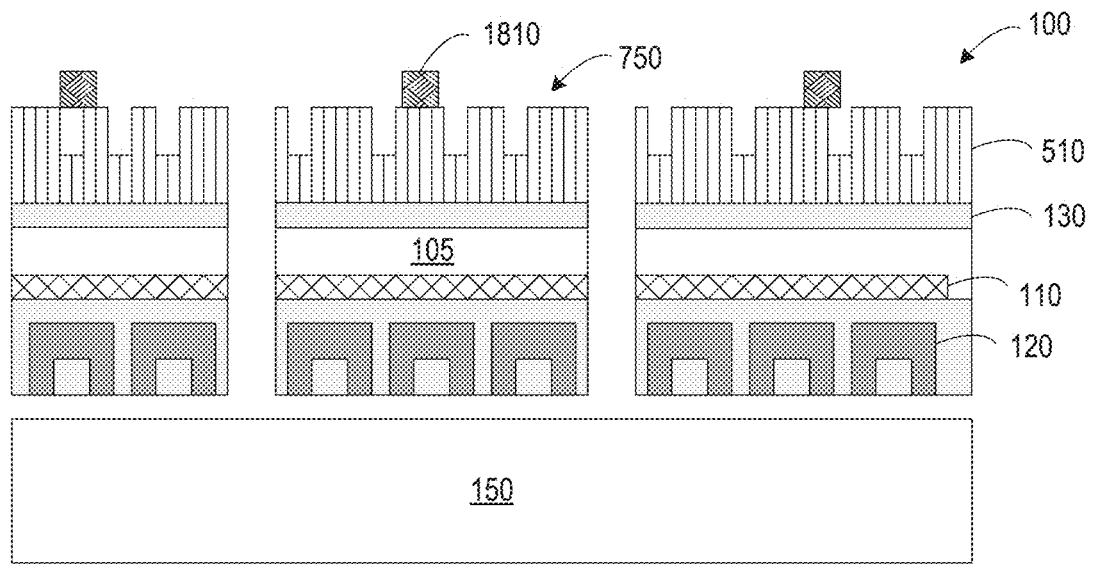

As shown in FIG. 18, chiplet supporters 1810 can be optionally formed on the patterned stress film 510 (or the stress film 410) for each of the chiplets 750 (or chiplets 1550), and the attachment material 210 can be removed via heating, for example, to separate the carrier substrate 150 from the chiplets 750 (or chiplets 1550). In an embodiment, the chiplet supporters 1810 can be used for holding the chiplets 750 (or chiplets 1550) in place during subsequent process steps, e.g., the cutting process step. For example, the chiplet supporters 1810 can be an adhesive. As another example, the chiplet supporters 1810 can be formed on the surface of the patterned stress film 510 in a random location for each of the chiplets 750 (or chiplets 1550). The chiplet supporters 1810 can be formed in any shape, e.g., a block, as shown in FIG. 18.

Figure 19:
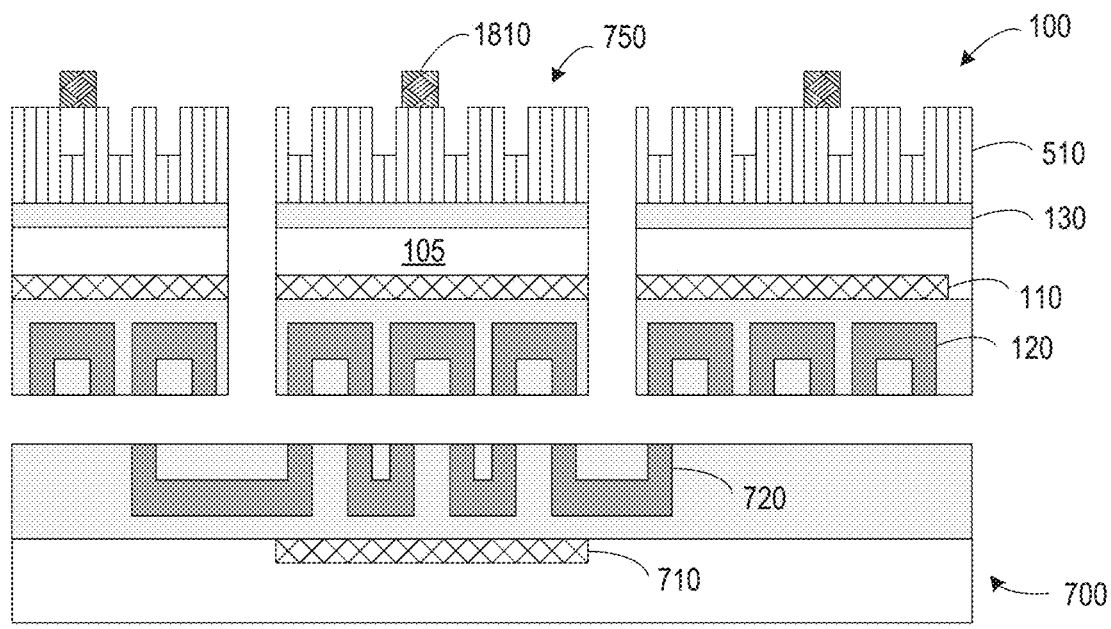

As shown in FIG. 19, one or more than one of the chiplets 750 (or chiplets 1550) can be bonded to another semiconductor structure. For example, the chiplet 750 (or chiplet 1550) can be bonded to the second semiconductor structure 700, which has the second circuit 710 and the second wiring structure 720, the second wiring structure 720 corresponding to the first wiring structure 120 of the first semiconductor structure 100.

Figure 20:
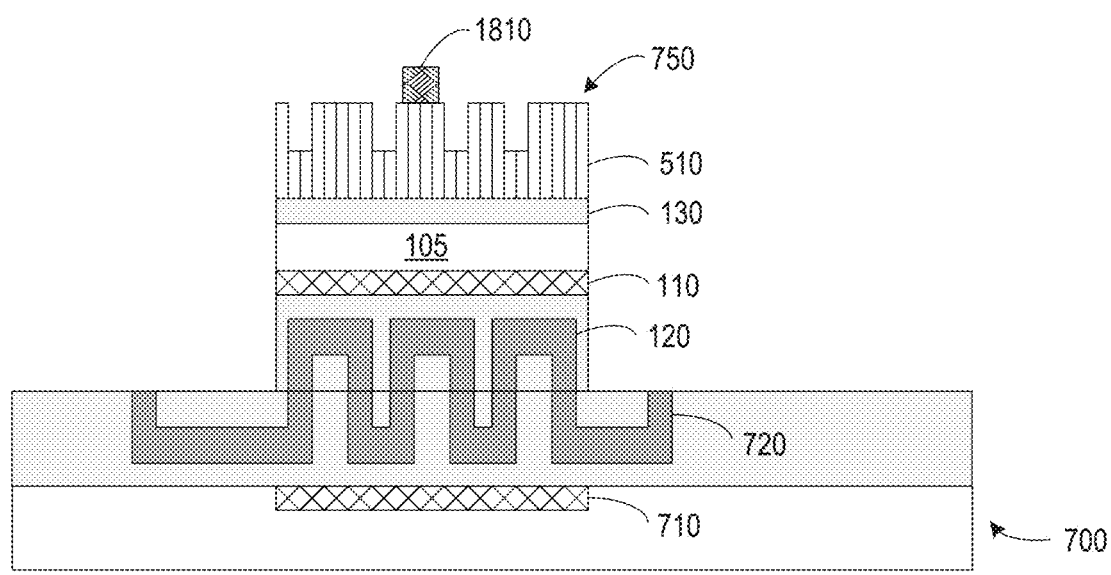

As shown in FIG. 20, the chiplet 750 (or chiplet 1550) can be bonded to the second semiconductor structure 700, with the first wiring structure 120 of the chiplet 750 (or chiplet 1550) being connected to the second wiring structure 720 of the second semiconductor structure 700. Then, the chiplet supporter 1810, the patterned stress film 510 (or the stress film 410) and the first dielectric layer 130 can be removed, to provide the structure as shown in FIG. 10. For example, the chiplet supporter 1810, the patterned stress film 510 and the first dielectric layer 130 can be removed via CMP in a single process or multiple processes.

Figure 21:
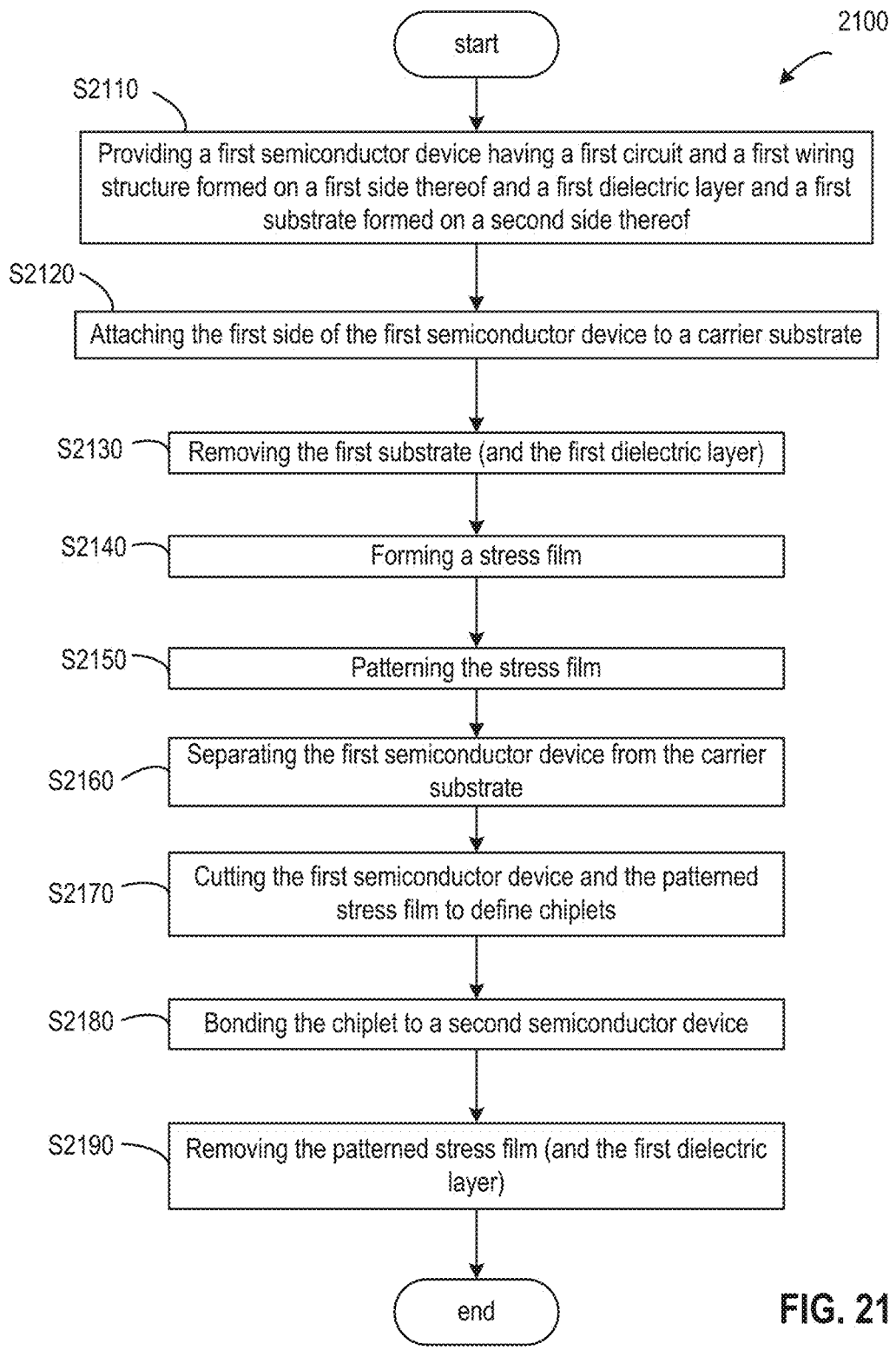
FIG. 21 is a flow chart illustrating a fourth exemplary method for forming a chiplet onto a semiconductor structure according to some embodiments of the present disclosure.

FIG. 21 is a flow chart illustrating a fourth exemplary method 2100 for forming a chiplet onto a semiconductor structure according to some embodiments of the present disclosure. In an embodiment, some of the steps of the fourth exemplary method 2100 shown can be performed concurrently or in a different order than shown, can be substituted by other method steps, or can be omitted. Additional method steps can also be performed as desired. In another embodiment, the fourth exemplary method 2100 can correspond to the first and second exemplary methods shown in FIGS. 1-16.

At step S2110, a first semiconductor structure can be provided. In an embodiment, the first semiconductor structure (e.g., the first semiconductor structure 100) can include a first circuit (e.g., the first circuit 110) and a first wiring structure (e.g., the first wiring structure 120) that are formed on a first side of the first semiconductor structure (e.g., the first side 100A) and a first dielectric layer (e.g., the first dielectric layer 130) and a first substrate (e.g., the first substrate 140) that are formed on a second side of the first semiconductor structure (e.g., the second side 100B).

At step S2120, the first side of the first semiconductor structure can be attached to a carrier substrate. For example, the first side 100A of the first semiconductor 100 can be attached to the carrier substrate 150 using the attachment material 210.

At step S2130, the first substrate (and the first dielectric layer) can be removed. For example, the first substrate 140 (and the first dielectric layer 130) can be removed via CMP.

At step S2140, a stress film can be formed on the second side (or the first dielectric layer) of the first semiconductor structure. For example, the stress film 410 can be formed on the first dielectric layer 130, as shown in FIG. 4. As another example, the stress film 410 can be formed on the second side 100B of the first semiconductor structure 100, as shown in FIG. 12.

At step S2150, optionally, the stress film can be patterned to form a patterned stress film. For example, the stress film 410 can be patterned with the direct-write to form the patterned stress film 510.

At step S2160, the first semiconductor structure can be separated from the carrier substrate. For example, the attachment layer 210 can be heated and vaporized such that the first semiconductor structure 100 can be separated from the carrier substrate 150.

At step S2170, the first semiconductor structure along with the patterned stress film (or the stress film) can be cut to define a plurality of chiplets. For example, the first semiconductor structure 100 along with the patterned stress film 510 (or the stress film 410) can be cut via etching, for example, to define the chiplets 750/1550.

At step S2180, one or more than one of the chiplets can be bonded to another semiconductor structure. For example, the chiplet 750/1550 can be bonded to the second semiconductor structure 700, which has the second circuit 710 and the second wiring structure 720, with the first wiring structure 120 of the chiplet 750/1550 being connected to the second wiring structure 720 of the second semiconductor structure 700.

At step S2190, the patterned stress film (or the stress film) (and the first dielectric layer) can be removed. For example, the patterned stress film 510 (or the stress film 410) (and the first dielectric layer 130) can be removed via CMP.

Figure 22:
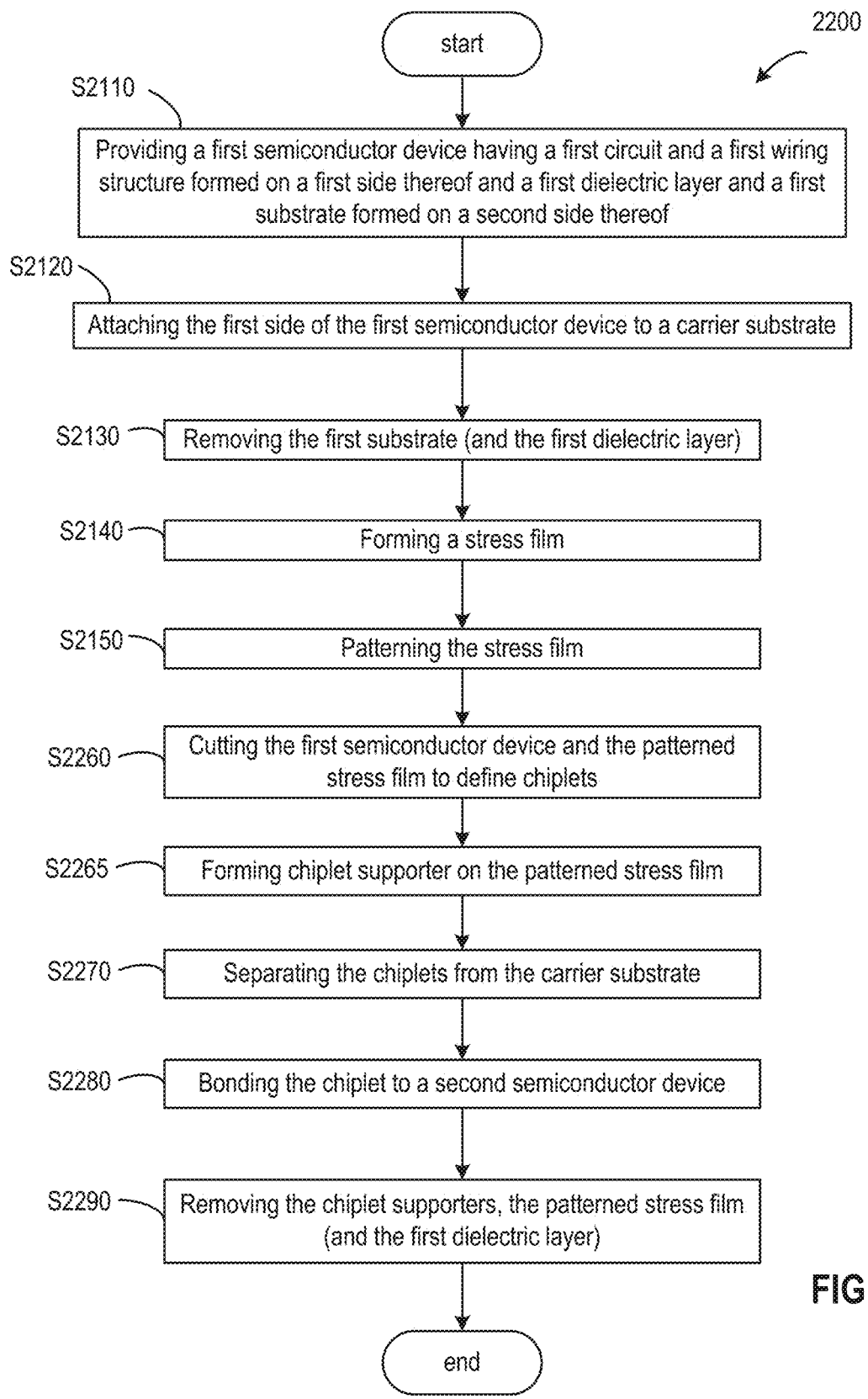
FIG. 22 is a flow chart illustrating a fifth exemplary method for forming a chiplet onto a semiconductor structure according to some embodiments of the present disclosure.

FIG. 22 is a flow chart illustrating a fifth exemplary method 2200 for forming a chiplet onto a semiconductor structure according to some embodiments of the present disclosure. In an embodiment, some of the steps of the fifth exemplary method 2200 shown can be performed concurrently or in a different order than shown, can be substituted by other method steps, or can be omitted. Additional method steps can also be performed as desired. In another embodiment, the fifth exemplary method 2200 can correspond to the third exemplary method shown in FIGS. 17-20. The fifth exemplary method 2200 can also include steps S2110-S2150.

At step S2260, the first semiconductor structure along with the patterned stress film (or the stress film) can be cut to define a plurality of chiplets. For example, the first semiconductor structure 100 along with the patterned stress film 510 (or the stress film 410) can be cut via etching, for example, to form the chiplets 750/1550, with the carrier substrate 150 and the attachment material 210 being kept in place and the chiplets 750/1550 being separated from the carrier substrate 150 at a future step at a chiplet level.

At step S2265, optionally, chiplet supporters can be formed on the patterned stress film (or the stress film) for each of the chiplets. For example, the chiplet supporters 1810 can be formed on the patterned stress film 510 (or the stress film 410) for each of the chiplets 750 (or chiplets 1550).

At step S2270, the chiplets can be separated from the carrier substrate. For example, the attachment layer 210 can be heated and vaporized such that the chiplets 750/1550 can be separated from the carrier substrate 150.

At step S2280, one or more than one of the chiplets can be bonded to another semiconductor structure. For example, the chiplet 750/1550 can be bonded to the second semiconductor structure 700, which has the second circuit 710 and the second wiring structure 720, with the first wiring structure 120 of the chiplet 750/1550 being connected to the second wiring structure 720 of the second semiconductor structure 700.

At step S2290, the chiplet supporters and the patterned stress film (or the stress film) (and the first dielectric layer) can be removed. For example, the chiplet supporters 1810 and the patterned stress film 510 (or the stress film) (and the first dielectric layer 130) can be removed via CMP.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:
1. A method, comprising:
providing a first semiconductor structure having a first circuit and a first wiring structure formed on a first side thereof;

attaching the first side of the first semiconductor structure to a carrier substrate;

forming a stress film on a second side of the first semiconductor structure;

separating the carrier substrate from the first semiconductor structure;

cutting the stress film and the first semiconductor structure to define at least one chiplet;

bonding the at least one chiplet to a second semiconductor structure that has a second circuit and a second wiring structure such that the second wiring structure is connected to the first wiring structure; and removing the stress film after the at least one chiplet is bonded to the second semiconductor structure.

2. The method of claim 1, further comprising patterning the stress film to form a patterned stress film, wherein cutting the stress film and the first semiconductor structure to define at least one chiplet includes cutting the patterned stress film and the first semiconductor structure to define at least one chiplet.

3. The method of claim 2, wherein the patterned stress film is formed via a mask-based lithography tool, a direct-write lithography tool or ultraviolet (UV) cross-linking.

4. The method of claim 3, wherein the patterned stress film is formed via the direct-write lithography tool using a digital light processing (DLP) chip, a grating light valve or a laser galvanometer.

5. The method of claim 1, wherein the first semiconductor structure further has a first dielectric layer formed on the second side thereof, and the stress film is formed on the first dielectric layer of the first semiconductor structure.

6. The method of claim 5, wherein the first semiconductor structure further has a first substrate formed on the first dielectric layer, and the method further comprises, prior to forming a stress film on the first dielectric layer of the first semiconductor structure, removing the first substrate to uncover the first dielectric layer.

7. The method of claim 1, wherein the first side of the first semiconductor structure is attached to the carrier substrate using an attachment material, and separating the carrier substrate from the first semiconductor structure includes heating the attachment material such that the carrier substrate is separated from the first semiconductor structure.

8. A method, comprising:

providing a first semiconductor structure having a first circuit and a first wiring structure formed on a first side thereof;

attaching the first side of the first semiconductor structure to a carrier substrate;

forming a stress film on second side of the first semiconductor structure;

cutting the stress film and the first semiconductor structure to define at least one chiplet;

forming a chiplet supporter on the stress film of the at least one chiplet;

separating the carrier substrate from the at least one chiplet;

bonding the at least one chiplet to a second semiconductor structure that has a second circuit and a second wiring structure such that the second wiring structure is connected to the first wiring structure; and removing the chiplet supporter and the stress film after the at least one chiplet is bonded to the second semiconductor structure.

9. The method of claim 8, further comprising patterning the stress film to form a patterned stress film, wherein cutting the stress film and the first semiconductor structure to define at least one chiplet includes cutting the patterned stress film and the first semiconductor structure to define at least one chiplet.

10. The method of claim 9, wherein the patterned stress film is formed via a mask-based lithography tool, a direct-write lithography tool or UV cross-linking.

11. The method of claim 10, wherein the patterned stress film is formed via the direct-write lithography tool using a DLP chip, a grating light valve, or a laser galvanometer.

12. The method of claim 8, wherein the first semiconductor structure further has a first dielectric layer formed on the second side thereof, and the stress film is formed on the first dielectric layer of the first semiconductor structure.

13. The method claim 12, wherein the first semiconductor structure further has a first substrate formed on the first dielectric layer, and the method further comprises, prior to forming a stress film on the first dielectric layer of the first semiconductor structure, removing the first substrate to uncover the first dielectric layer.

14. The method of claim 8, wherein the first side of the first semiconductor structure is attached to the carrier substrate using an attachment material, and cutting the stress film and the first semiconductor structure to define at least one chiplet includes cutting the stress film, the first semiconductor structure and the attachment material to define at least one chiplet.

15. The method of claim 14, wherein cutting the stress film, the first semiconductor structure and the attachment material to define at least one chiplet includes cutting the stress film, the first semiconductor structure, the attachment material and a portion of the carrier substrate to define at least one chiplet.

16. The method of claim 8, wherein the first side of the first semiconductor structure is attached to the carrier substrate using an attachment material, and separating the carrier substrate from the at least one chiplet includes heating the attachment material such that the carrier substrate is separated from the at least one chiplet.

* * * * *

UNITED STATES PATENT AND TRADEMARK OFFICE
CERTIFICATE OF CORRECTION

| | |
|---|---|
| PATENT NO. | : 11,721,551 B2 |
| APPLICATION NO. | : 17/473248 |
| DATED | : August 8, 2023 |
| INVENTOR(S) | : Devilliers et al. |

It is certified that error appears in the above-identified patent and that said Letters Patent is hereby corrected as shown below:

In the Claims

In Column 12, Claim 13, Line 28, after "method", insert -- of --.

Signed and Sealed this
Thirteenth Day of February, 2024

Katherine Kelly Vidal
*Director of the United States Patent and Trademark Office*